(12) United States Patent
Jordy (10) Patent No.: US 7,391,275 B2
(45) Date of Patent: Jun. 24, 2008

(54) CIRCUITS AND METHODS FOR A RING OSCILLATOR WITH ADJUSTABLE DELAY AND/OR RESONATOR TANK STAGE

(75) Inventor: George Jordy, Hopewell Junction, NY (US)

(73) Assignee: Seiko Epson Corporation, Tokyo (JP)

( * ) Notice: Subject to any disclaimer, the term of this patent is extended or adjusted under 35 U.S.C. 154(b) by 203 days.

(21) Appl. No.: 11/184,235

(22) Filed: Jul. 18, 2005

(65) Prior Publication Data
US 2007/0013453 A1    Jan. 18, 2007

(51) Int. Cl.
*H03L 5/00* (2006.01)
(52) U.S. Cl. ............... 331/57; 331/117 FE; 331/183
(58) Field of Classification Search .......... 331/57, 331/117 FE, 183
See application file for complete search history.

(56) References Cited

U.S. PATENT DOCUMENTS

| | | | | |
|---|---|---|---|---|
| 5,561,398 | A | | 10/1996 | Rasmussen |
| 5,568,099 | A | * | 10/1996 | Du ............................ 331/57 |
| 6,081,166 | A | * | 6/2000 | Katakura ..................... 331/57 |
| 6,396,360 | B1 | | 5/2002 | Cai |
| 6,529,084 | B1 | * | 3/2003 | Boerstler et al. ............. 331/57 |
| 6,686,806 | B2 | * | 2/2004 | Dufour ....................... 331/57 |
| 6,690,243 | B1 | * | 2/2004 | Henrion ................. 331/117 R |
| 6,744,325 | B2 | | 6/2004 | Krawczyk, Jr. et al. |
| 6,861,916 | B2 | | 3/2005 | Dally et al. |

* cited by examiner

*Primary Examiner*—Robert Pascal
*Assistant Examiner*—James Goodley (57) ABSTRACT

Circuits and methods for generating an oscillator output. The circuit generally includes a ring oscillator, with a series of inverters connected in series and an LC resonator tank (or a variable resistance) coupled to the input and output of the inverter series. The method generally includes the steps of applying an operating voltage to such a circuit and generating an oscillator signal. The circuits and methods may be employed as a VCO component of a phase-locked loop. The upper limit of the oscillator signal frequency may be configured by altering or controlling the variable resistance and/or one or more parameters of the LC resonator tank. The circuit design demonstrates a high tolerance to variations in circuit or circuit component values.

10 Claims, 7 Drawing Sheets

CIRCUITS AND METHODS FOR A RING OSCILLATOR WITH ADJUSTABLE DELAY AND/OR RESONATOR TANK STAGE

FIELD OF THE INVENTION

The present invention generally relates to oscillators and, in particular, to a technique for creating oscillators with high tolerance to variable and/or varying component values.

DISCUSSION OF THE BACKGROUND

A ring oscillator typically comprises a number of inverters connected in series as a ring. The inherent delays within each inverter cause the ring oscillator to oscillate in proportion to the total gate delay of the inverters in the ring.

Figure 1:
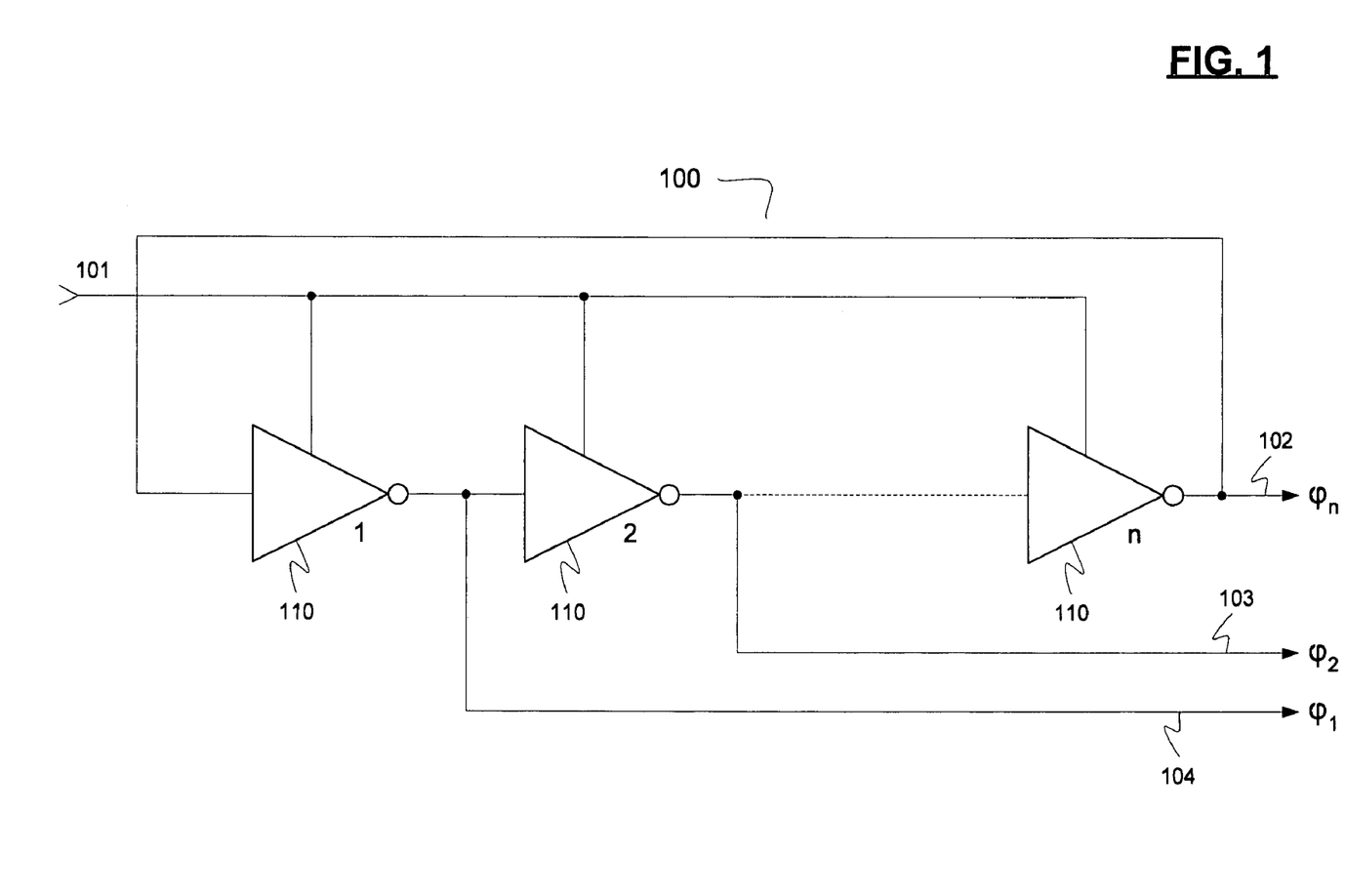
FIG. 1 is a diagram showing a conventional inverter-based ring oscillator circuit.

FIG. 1 shows a typical ring oscillator 100 comprising an odd number of inverters 110. A tunable current source 101 may be provided to adjust the delay within each inverter 110, generally varying the oscillation frequency. One feature inherent in ring oscillator designs is that multiple phases of oscillation may be obtained at outputs 102-104 of inverters 110. Each of the inverters in FIGS. 1 and 2 are typically formed of CMOS transistors.

Existing voltage controlled oscillators (VCOs) use a variable capacitor or a current controlled source to control, adjust or influence the delay. The delay of each inverter is generally dependent upon the control input voltage in addition to the current provided by current source 101. Existing VCOs therefore generally require exacting attention to operating conditions and/or startup circuits.

VCOs with low gain tend to be more stable than VCOs with high gain. At high gain the voltage potential of the oscillation signal may reach levels that can introduce non-linearities to one or more components of the system. High gain VCOs therefore generally must adjust for process parameters to retain a nearly linear gain slope in the frequency vs. voltage curve (MHz/V). This can be challenging to implement. Therefore it is generally desirable to limit the gain of the oscillator.

Furthermore, in phase-locked loop (PLL) applications, it is useful to limit the frequency of oscillation and to keep the circuit within the capabilities of the phase detector/phase frequency detector (PD/PFD) and the locking circuitry. Also, in some cases limiting the maximum frequency can help to prevent runaway (i.e., a condition where the loop cannot lock and the frequency continually increases until the system fails.)

Thus it is desirable to have a relatively stable voltage controlled oscillator that demonstrates a high tolerance to variable and/or varying component values (e.g., process corners), and which imposes an upper bound on the output frequency.

SUMMARY OF THE INVENTION

Embodiments of the present invention relate to circuits and methods for generating and/or tuning oscillator output(s).

The present invention advantageously allows for an upper limit of the output frequency to be configured by adjusting (1) the inductance and/or capacitance of the LC resonance tank and/or (2) the delay between two (or more) stages of a ring oscillator. Furthermore, the circuit design demonstrates a high tolerance to variable and/or varying component values.

In one aspect, the circuit relates to a ring oscillator, generally comprising multiple inverters connected in series, with an LC (inductor and capacitor) resonator tank connected between the last and first inverters in the series. In another aspect, the circuit relates to a ring oscillator, generally comprising multiple inverters connected in series with a variable resistance connected between the last and first inverters in the series. In yet another aspect, the circuit relates to a phase-locked loop, comprising a frequency detector and a voltage controlled oscillator comprising one of these ring oscillators.

Yet another aspect of the invention concerns a method for generating an oscillation signal comprising the steps of (a) applying an operating voltage to a ring comprising multiple inverters connected in series with an LC resonator tank connected between the last and first inverters in the series, and (b) outputting an oscillator signal from the ring. In a still further aspect, the invention concerns a method for controlling an oscillation signal, comprising (a) generating a periodic signal from a signal source, (b) passing the signal through an LC resonator tank, and (c) passing an output of the LC resonator tank to an input of the signal source.

These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer or data processing system, or similar processing device (e.g., an electrical, optical, or quantum computing or processing device), that manipulates and transforms data represented as physical (e.g., electronic) quantities. The terms refer to actions and processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for convenience and simplicity, the terms "clock," "time," "rate," "period" and "frequency" are generally interchangeable herein, but are generally given their art-recognized meanings. Also, for convenience and simplicity, the terms "data," "signal," "waveform" and "information" may be used interchangeably, as may the terms "connected to," "coupled with," "coupled to," and "in communication with," which may refer to direct and/or indirect connections and/or couplings, as the case may be, but these terms are generally given their art-recognized meanings.

The present invention concerns circuits and methods for generating oscillator output. The circuit is generally a ring oscillator, with a series of inverters connected in series. The ring is formed with an LC resonator tank coupled to the input and output of the inverter series. The method generally includes the steps of applying an operating voltage to such a circuit and generating an oscillator signal. The circuits and methods may be employed as a VCO component of a phase-locked loop (PLL). The upper limit of the oscillator signal frequency may be configured by altering the inductance and/or capacitance of the LC resonator tank, clamping the output of the LC resonator tank, and/or controlling a resistance between stages of the loop. The circuit design demonstrates a high tolerance to component values.

The invention, in its various aspects, will be explained in greater detail below with regard to exemplary embodiments.

An Exemplary Ring Oscillator

In one aspect, the present invention relates to a ring oscillator circuit generally comprising multiple inverters connected in series. See, for example, inverters 204, 205, and 206 of simplified block diagram 200 of FIG. 2. Each inverter conventionally comprises a pair of CMOS transistors, one an n-channel transistor and the other a p-channel transistor. See, for example, inverter 330 of detailed circuit 300 in FIG. 3, where inverter 300 comprises transistors 331 and 332. However, the present invention is not limited to single-ended CMOS inverter-based ring oscillators. Other types of ring oscillators based on or employing bipolar transistors, depletion-mode transistors, or differential inverter stages, are also suitable for use in the present invention.

Referring back to FIG. 2, the output of last inverter 206 in the series of inverters 204-206 couples to an input of Adjustable Delay/Tank stage 210. The output of stage 210 is generally connected to the input of first inverter 204 in the series of inverters, thus forming the oscillator ring. It will be recognized that the circuit may generally be tapped at any point to provide an oscillator output. More than three inverters may be used in the circuit in order to provide outputs of varying phases. Generally an odd number (e.g., 2n+1, where n is an integer) of inverters may be used if the inverter ring is single-ended, but an even number of inverters (and, in one embodiment, 4n inverters, where n is an integer) may be used if the ring has differential inputs and outputs.

Other components may be placed at intermediate points (e.g. between stages) in the ring as is done, for example, in some of the alternate embodiments of the present invention. For example, in FIG. 3, Adjustable Delay/Tank stage 210 comprises LC resonator tank 201, trip-point circuit 202, and variable resistance 203. (Each of these substages is further described herein.)

LC resonator tank 201 generally comprises an inductor and a capacitor. See, for example, inductor 301 and capacitor 302 of FIG. 4.

Figure 3:
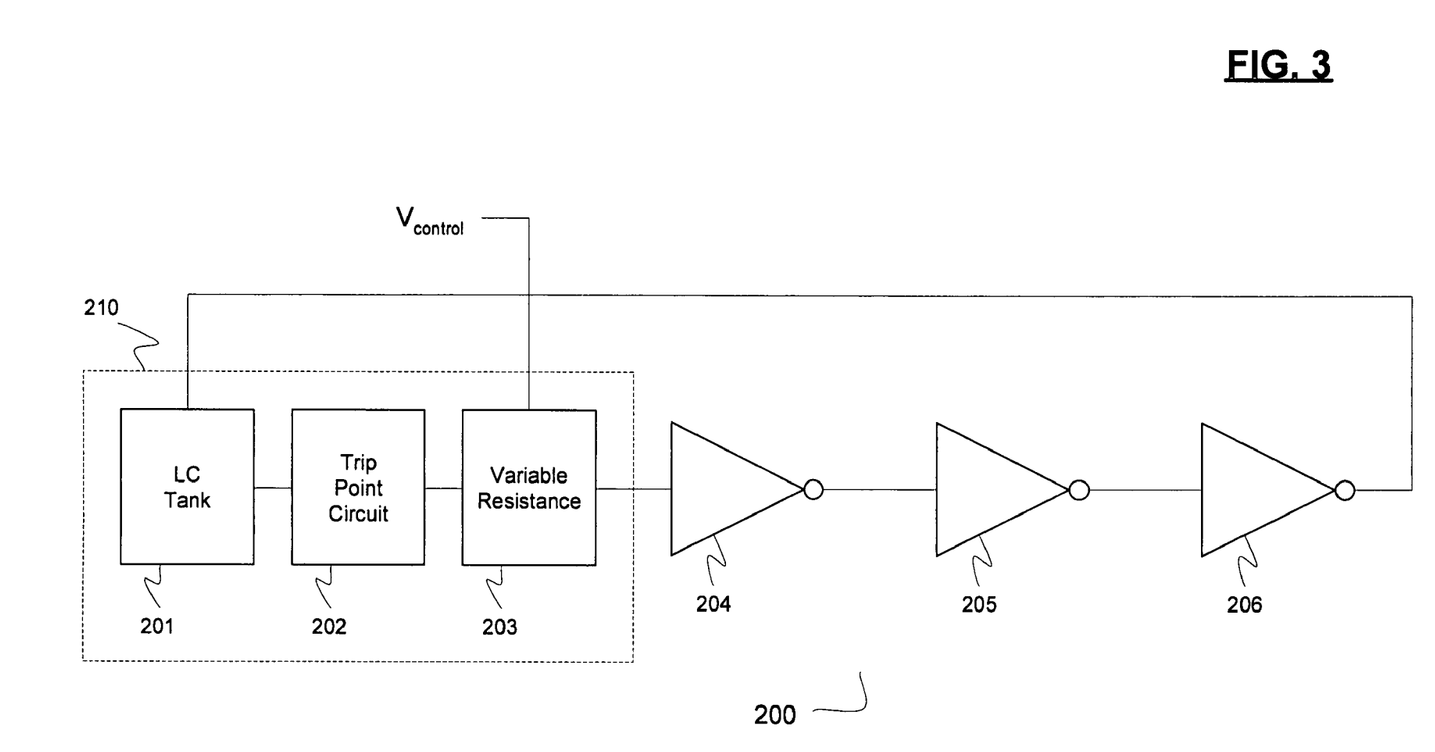
FIG. 3 is a simplified topology of an exemplary ring oscillator according to the present invention, with a plurality of inverter stages and an elaborated Adjustable Delay/Tank stage.

Referring to FIG. 3, in one embodiment, variable resistance 203 may be placed between the output of LC tank 201 and the input of first inverter 204. The resistance may be varied to alter the delay between the LC tank and the inverters, thereby altering the output frequency of the ring oscillator. In a preferred embodiment, the variable resistance comprises a transistor, configured to receive a bias voltage or control at its gate (or base, if bipolar) which may be changed to vary the resistance. See, for example, transistor 320 of FIG. 3, which corresponds to variable resistance 203.

The control voltage ($V_{control}$) may be provided by a conventional voltage generator. $V_{control}$ may vary according to predetermined relationships between or among one or more process and/or operating conditions (e.g., temperature, power supply variations or spikes, process corners, desired oscillator output frequency or frequency range) and the resistance of variable resistance 203 (or the frequency of the VCO [$f_{VCO}$], when the process or operating condition is not $f_{VCO}$). Design and implementation of such voltage generators is within the capabilities of one skilled in the art.

In a further embodiment, a trip point circuit may be placed between the output of LC tank 201 and the input of the first inverter 204. The trip point circuit is generally configured to maintain a low logic input to the first inverter of the series until the voltage potential of the LC tank output rises above a predetermined voltage point. This functionality, configuration, and/or behavior generally serves to clamp the tank output voltage to a range between a low logic input level (e.g. ground) and a high logic input level (e.g. Vcc).

Figures 6A, 6B:
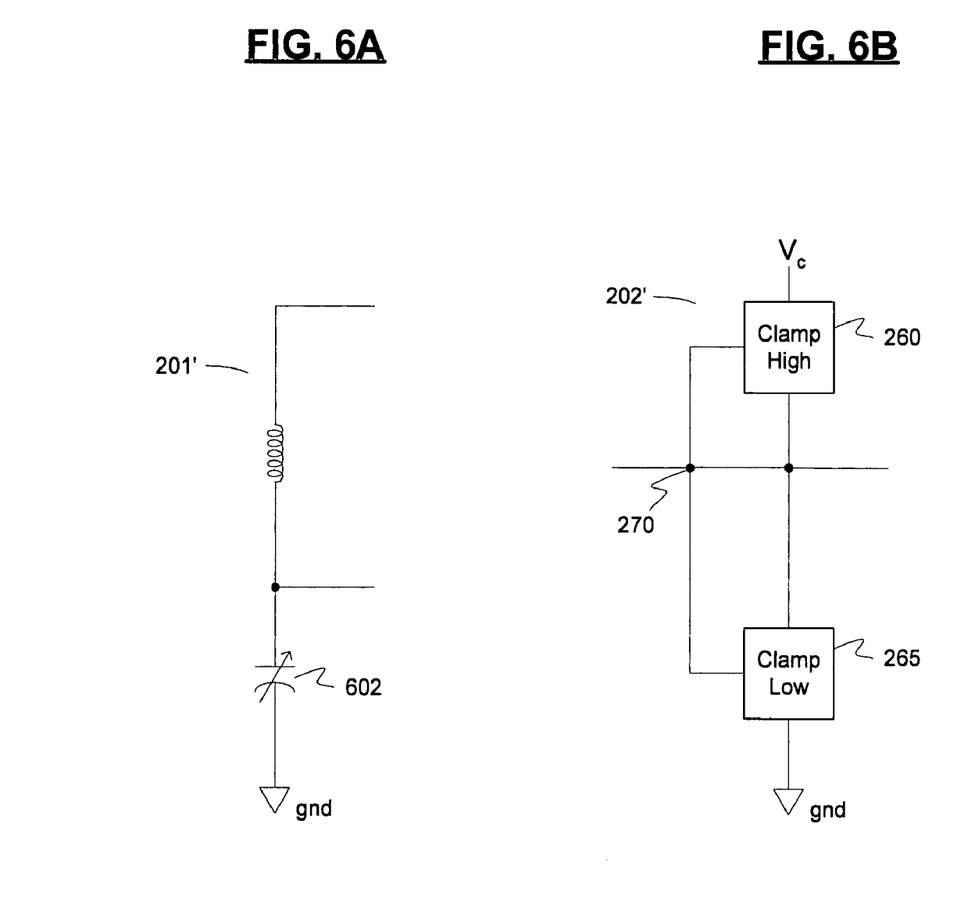
FIG. 6A is an alternative tank stage of an exemplary ring oscillator according to the present invention.
FIGS. 6B-C are alternative trip-point circuits for an exemplary ring oscillator according to the present invention.

FIG. 6B illustrates an exemplary trip-point circuit 202', wherein clamp low block 265 serves to clamp the input signal at node 270 to ground until the signal has a voltage potential higher than a threshold value above ground. Clamp high block 260 serves to clamp the oscillation signal to Vcc until the oscillation signal has a voltage potential lower than a threshold value below Vcc. When clamp high or clamp low circuits 260 and 261 comprise a series of diodes, the threshold voltage is generally n*$V_t$, where n is the number of diodes in the series, and $V_t$ is the threshold voltage differential for turning on the diode. The oscillation signal therefore remains within the range bounded by Vcc and ground, plus or minus a threshold value.

Figure 6C:
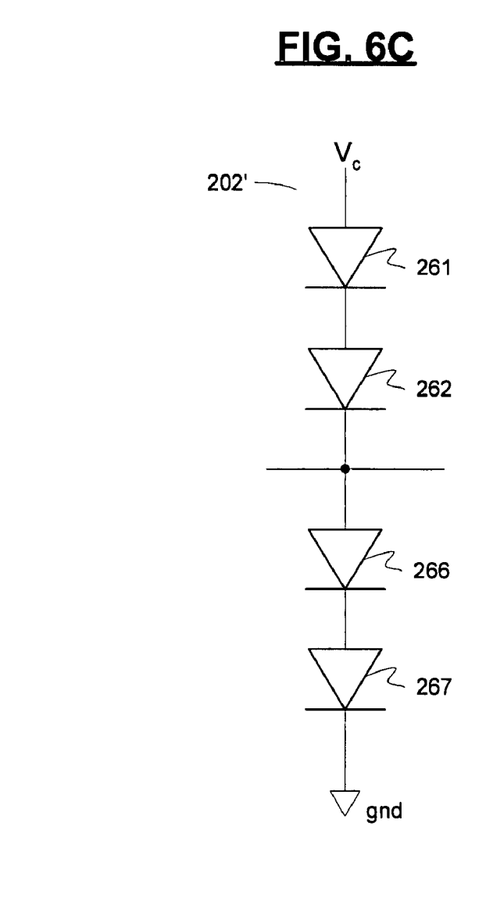

Referring now to FIG. 6C, in one embodiment the trip-point circuit includes multiple diodes connected in series, with first diode 261 in the series connects to a first power rail (Vcc), and last diode 267 in the series connected to a second power rail (ground), and with the LC tank output connected to diodes 262 and 266. Clamp high block 260 therefore may comprise diodes 261 and 262, and clamp low block 265 may comprise diodes 266 and 267. In a preferred embodiment, each diode may comprise a diode-connected transistor, where the base of the transistor is coupled to one of the gates of the transistor. See, for example, the detailed circuit diagram of FIG. 3, where trip-point circuit 310 comprises diode-connected transistors 311-314.

Furthermore, the trip-point circuit and variable resistance may be used in conjunction. See, for example, FIG. 3 where variable resistance 203 is placed between trip-point circuit 202 and first inverter 204. See also FIG. 4, where transistor 320, receiving $V_{control}$, is placed between trip-point circuit 310 and first inverter 330.

Figure 5:
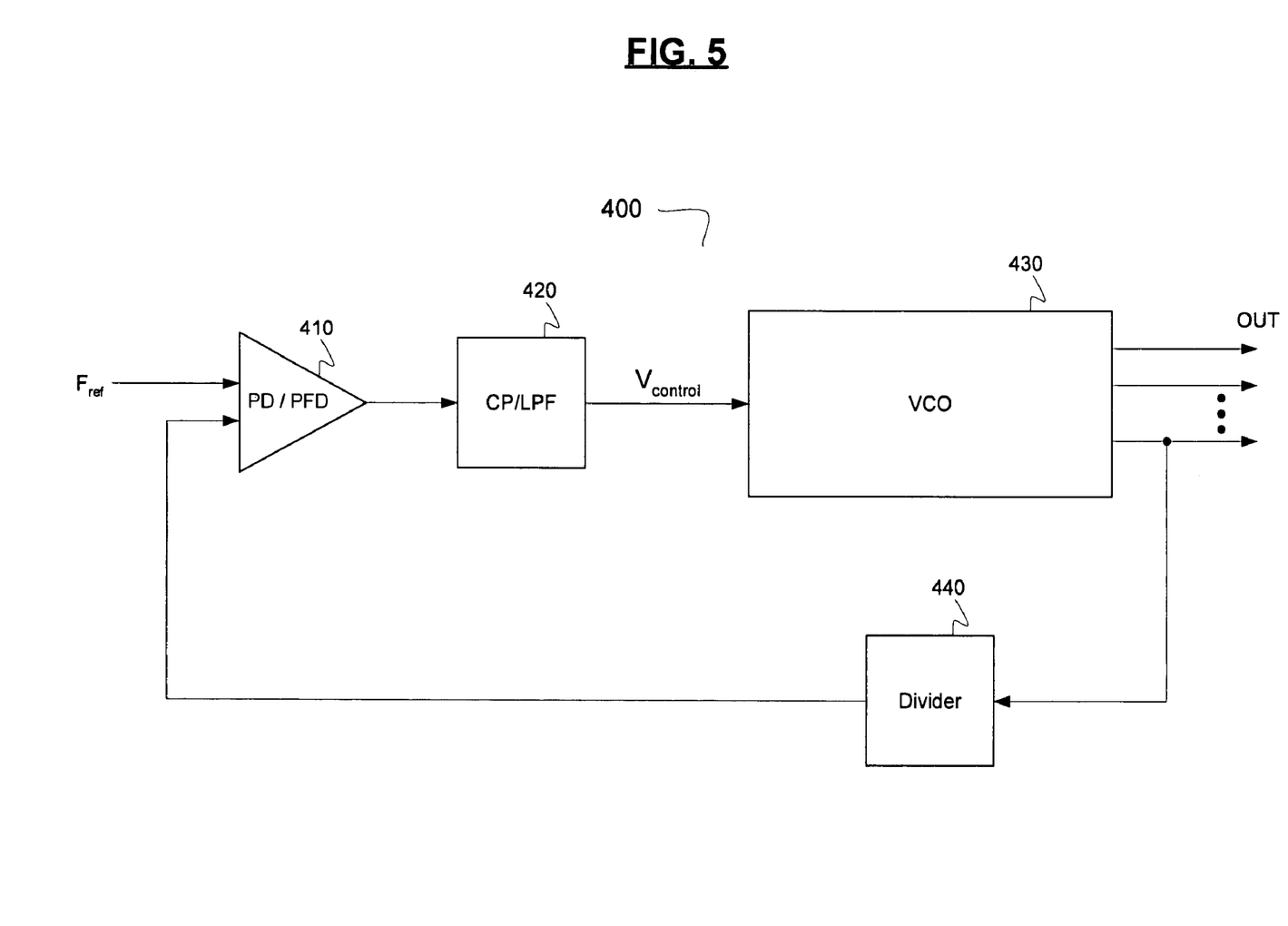
FIG. 5 is a simplified topology of a PLL application of the present invention.

Referring now to FIG. 5, in another aspect the invention relates to a phase-locked loop (PLL) comprising a frequency detector and the above ring oscillator configured to function as a voltage-controlled oscillator (VCO). The structure, function, and operation of a PLL are all well known in the art. PLLs generally comprise a phase detector or phase frequency detector (PD/PFD) 410, a charge pump and/or low pass filter 420, VCO 430, and usually some kind of output counter or divider 435. There may also be a divider in the reference path in order to make the PLL's output clock a rational multiple of the reference signal frequency. By replacing the simple divide-by-N counter in the feedback path with a programmable pulse-swallowing counter, it is possible to obtain fractional multiples of the reference frequency out of the PLL.

Conventionally VCO 430 generates the periodic output signal. If the frequency from VCO 430 falls behind that of the reference, PD/PFD 410 causes charge pump 420 to change $V_{control}$, so that the oscillator speeds up. Likewise, if the frequency creeps ahead of the reference, the phase detector causes the charge pump to change $V_{control}$ to slow down the oscillator. Low-pass filter 425 generally smoothes out abrupt control inputs from charge pump 420, so that system tends 400 towards a state where PD/PFD 410 makes very few (or at least relatively small) corrections.

The Method

The present invention further relates to methods for generating and/or adjusting an oscillation signal, generally using the above-described circuits. The methods generally comprise the steps of (a) applying an operating voltage to a ring comprising (i) a plurality of inverters connected in series and (ii) an LC resonator tank coupled between an input and an output of the series of inverters, and (b) outputting the oscillator signal from this ring.

A further embodiment additionally comprises the step of clamping the oscillator signal between two predetermined voltage levels. See, for example, trip-point circuit 202 of FIG. 2, the detailed trip-point circuit 310 of FIG. 3, or clamp circuit 202' of FIG. 6B, which may be coupled between the output of the LC resonator tank and the input of the first inverter. The trip-point circuit is generally configured to maintain a low logic input (e.g. ground) at said input of said plurality of inverters when a voltage potential at a tank output is below a predetermined level. Furthermore, the trip-point circuit may be configured to maintain a high logic input (e.g. Vcc) when a voltage potential at the tank output is above a predetermined level.

In another embodiment, the ring further comprises a variable resistance coupled between the output of the LC resonator tank and the input of the plurality of inverters. See, for example, variable resistance 203 of FIG. 3, which receives the output of LC resonator tank 201 (after it is passed through trip-point circuit 202, when trip-point circuit 202 is present). The output of variable resistance 203 is then passed to the input of first inverter 204.

In another embodiment the method further comprises the step of adjusting the frequency of said oscillation signal by adjusting the value of the variable resistance. Adjusting the value of variable resistance 203 will generally alter output frequency of the circuit by changing the delay time of that component. Thus, in an alternate embodiment, adjusting the output frequency may comprise changing the capacitance of a variable capacitor in the LC resonator tank (e.g., varactor or programmable capacitor array 602 in FIG. 6A).

Figure 4:
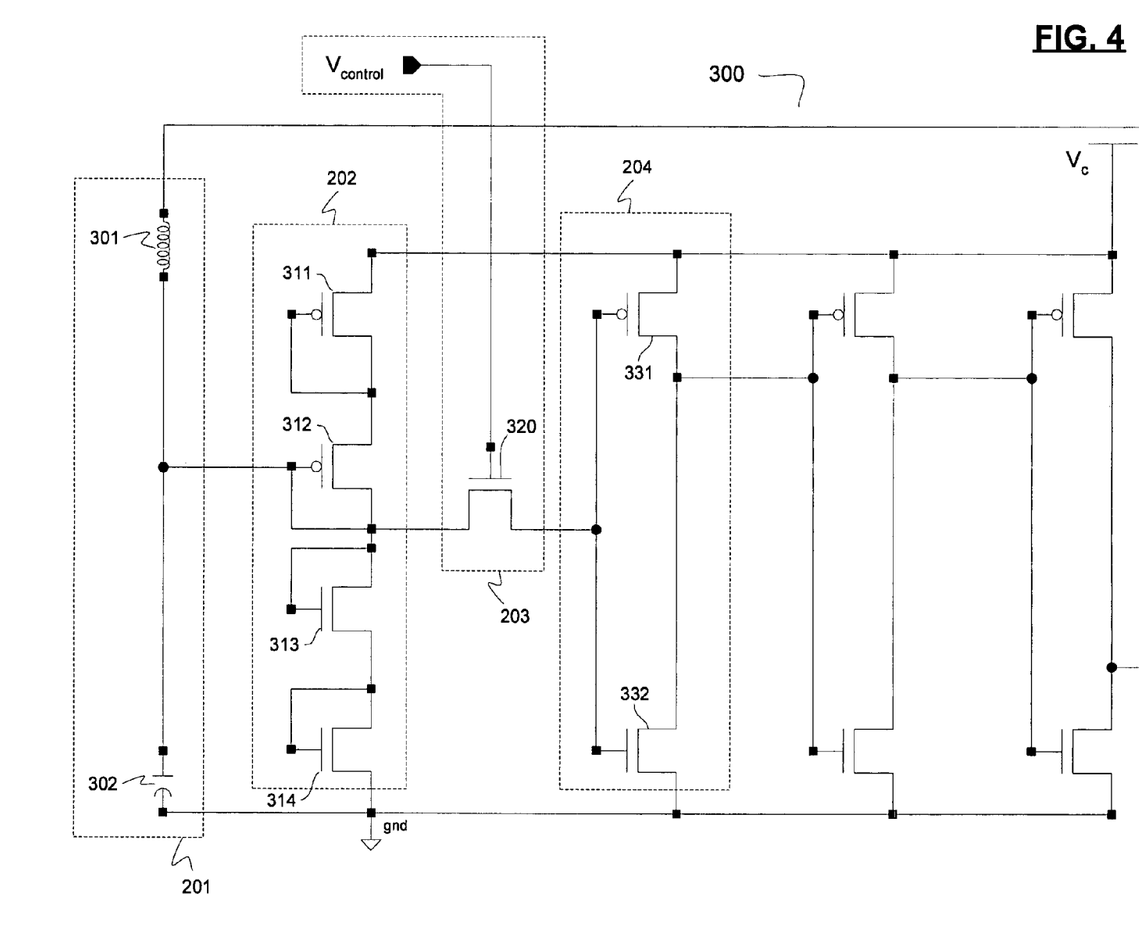
FIG. 4 is a circuit diagram of an exemplary ring oscillator according to the present invention.

Referring now to FIG. 4, the variable resistance may comprise a transistor 320 receiving a bias voltage $V_{control}$. The method may further comprise comprises adjusting the frequency of the oscillation signal by changing or adjusting $V_{control}$. $V_{control}$ may be changed or adjusted automatically in response to a change in value of VCO or PLL parameters (e.g. loss of lock, temperature, process corner, change in Vcc [e.g. noise, voltage spike]) or it may be selected by a user or manufacturer (e.g., to select a desired or predetermined frequency range).

Figure 7A:
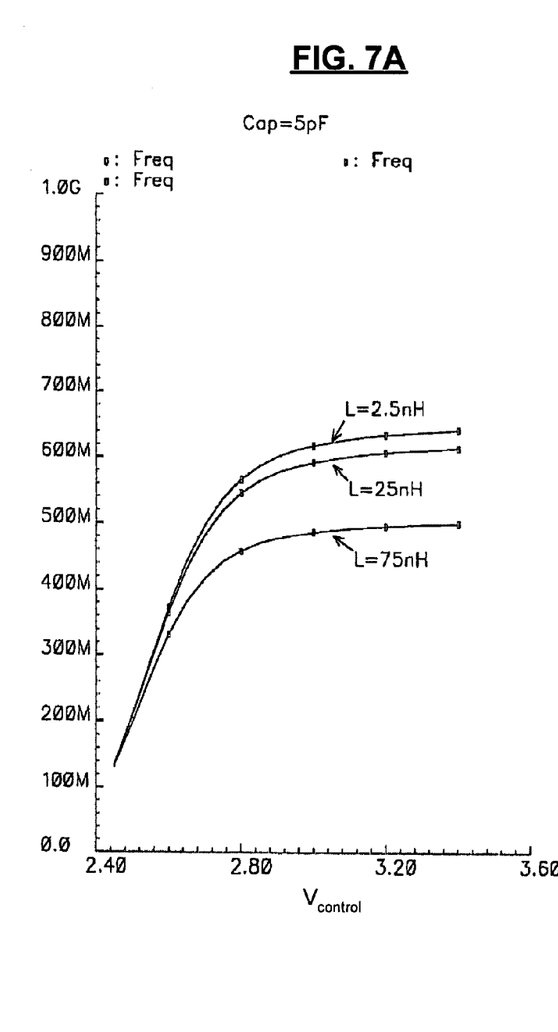
FIG. 7A shows an exemplary pulling curve for the present invention, showing the output frequency of an oscillator as a function of control voltage $V_{control}$ for a single capacitance value with three different inductance values.
Figure 7B:
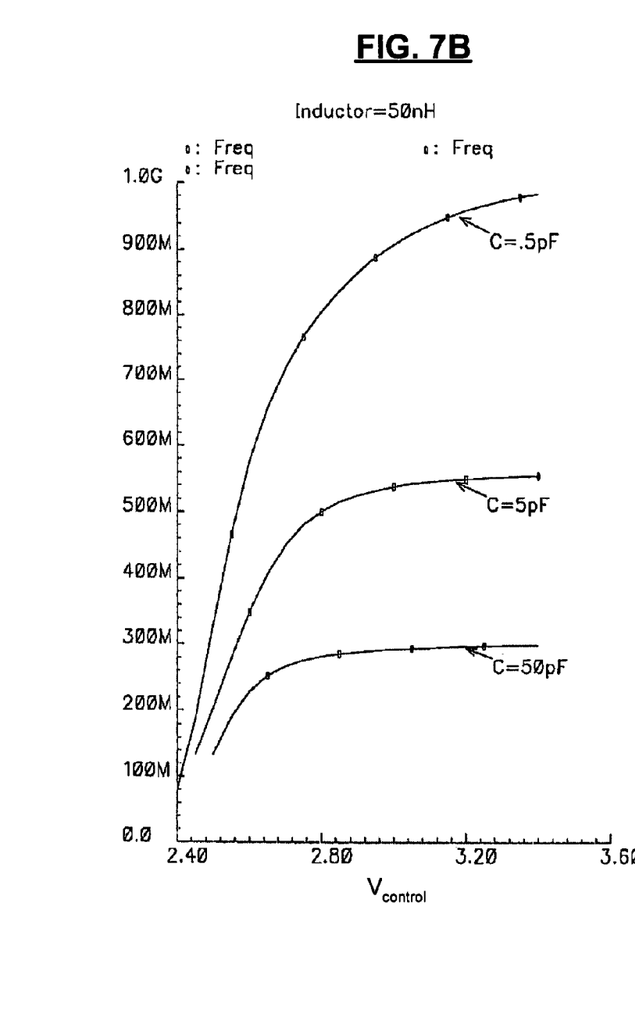
FIG. 7B shows an exemplary pulling curve for the present invention, showing the output frequency of an oscillator as a function of control voltage $V_{control}$ for a single inductance value with three different capacitance values.

$V_{control}$ is generally kept within the range of voltages that enable oscillation of the VCO. FIGS. 7A-B, for example, demonstrates the range of frequencies that may be produced by the present invention given a variety of capacitance (C) and inductance (L) values of LC resonator tank 201. An important point to note is that the circuit topology and transistors do not change, demonstrating a high tolerance to component values over a wide range of frequencies in which the gain slope is substantially linear (e.g. over the range $V_{control} \leq 2.6$ volts).

In a further embodiment, the frequency of the oscillation signal has an upper limit determined at least in part by the resonant frequency of LC resonator tank 201. If the natural frequency of the tank circuit is very high then the frequency limit of the oscillator will be largely determined by the delay of the series of inverters 204-206, and by the delay introduced by variable resistance 203, which, in preferred embodiments, is changed or adjusted by the value of $V_{control}$.

Figure 2:
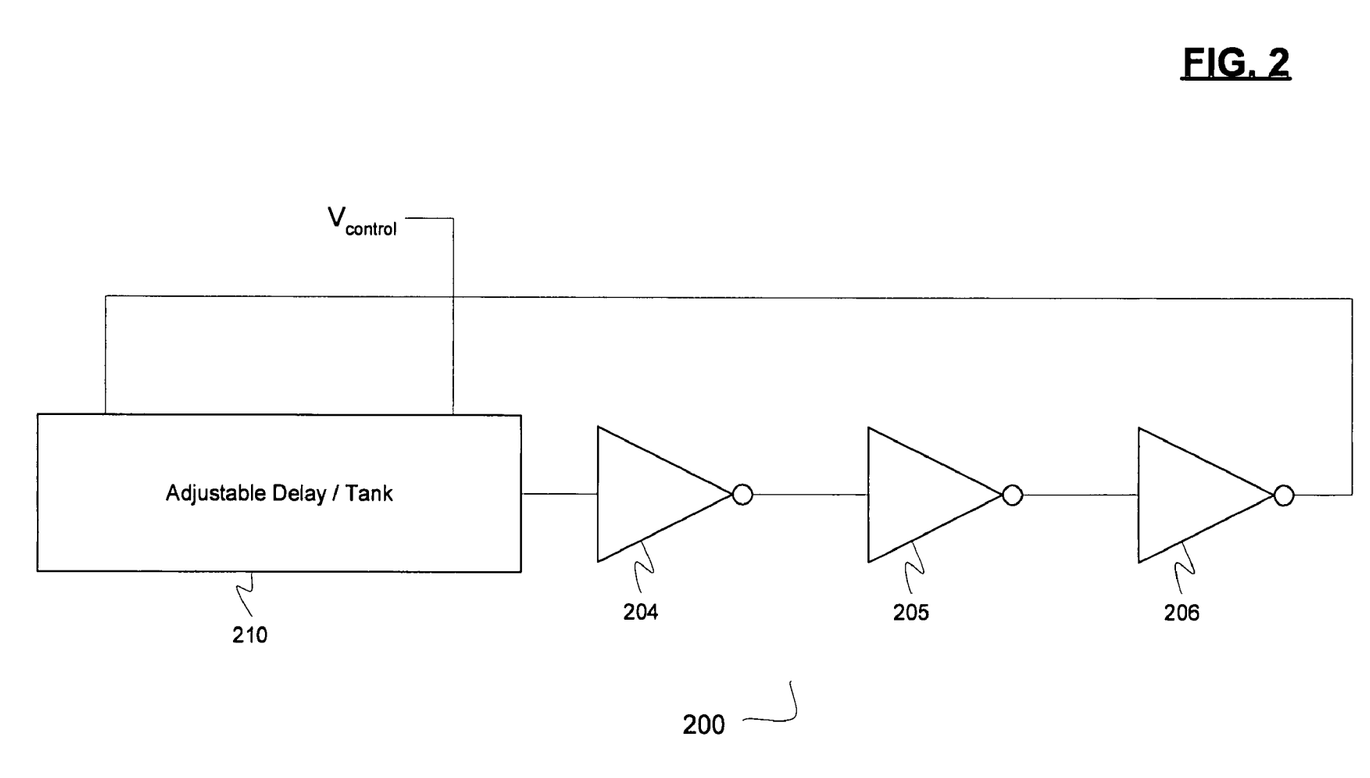
FIG. 2 is a simplified topology of an exemplary ring oscillator according to the present invention, with a plurality of inverter stages and an Adjustable Delay/Tank stage.

Although specific steps are disclosed in regard to the operation of exemplary ring oscillators of FIGS. 2-4, and the exemplary phase-locked loop of FIG. 5, such steps are exemplary. That is, the present invention is well suited to use with various other steps or variations of the steps described above. Additionally, for purposes of clarity and brevity, the discussion herein is directed at times to specific examples. The present invention, however, is not limited solely to use with a particular architecture or device (e.g., voltage controlled oscillators, phase-locked loops). Instead, the present invention is well suited to use with other types of hardware and processes in which it may be desirable to accomplish a multitude of tasks as part of an overall process directed at generating oscillation signals.

CONCLUSION/SUMMARY

Thus, the present invention provides circuits and methods for generating oscillator output. The circuits and methods may be employed as a voltage controlled oscillator (VCO) component of a phase-locked loop (PLL). The upper limit of the output frequency may be configured by altering the inductance and/or capacitance of the LC resonator tank, and the circuit design demonstrates a high tolerance to component values.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A ring oscillator, comprising:
   a) an inverter chain comprised of a plurality of inverters connected in series including a first inverter at a first end of said inverter chain and a last inverter at a second end of said inverter chain opposite said first end, each of said inverters having a single input and a single output;
   b) a tank comprising an inductor, a capacitor, an input tank node coupled to the output of said last inverter, and an output tank node coupled to the input of said first inverter; and
   c) a trip point circuit coupled between said tank and said inverter chain, said trip-point circuit configured to maintain a low logic signal at the input of said first inverter when a voltage potential at said output tank node is below a predetermined level;
   wherein said trip-point circuit comprises a first diode chain consisting of a first plurality of diodes connected in series and a second diode chain consisting of a second plurality of diodes connected in series, said first diode chain being connected to said second diode chain at a junction diode node, wherein:
   a first diode node at a first end of said first diode chain is connected to a first power rail and said junction diode node is at a second end of said first diode chain opposite said first end of said first diode chain;
   a second diode node at a first end of said second diode chain is connected to a second power rail and said junction diode node is at a second end of said second diode chain opposite said first end of said second diode chain; and
   said output tank node is coupled to said junction diode node.

2. The ring oscillator of claim 1, further comprising a variable resistance coupled between said output tank node and the input of said first inverter, said variable resistance being configured to vary its resistance in response to a control input.

3. The ring oscillator of claim 1, wherein an first end of said inductor is said input tank node and an opposite end of said inductor is said output tank node, and a first end of said capacitor is coupled to a power rail an opposite end of said capacitor is said output tank node.

4. The ring oscillator of claim 2, wherein said variable resistance comprises a transistor receiving a bias voltage.

5. The ring oscillator of claim 2, wherein said ring oscillator is a voltage controlled oscillator having a single voltage control input comprised by said control input.

6. The ring oscillator of claim 2, further comprising an oscillator output having a frequency with an upper limit determined at least in part by a resonant frequency of said tank.

7. A ring oscillator, comprising:
   a) an inverter chain comprised of a plurality of inverters connected in series including a first inverter at a first end of said inverter chain and a last inverter at a second end of said inverter chain opposite said first end, having a single input and a single output;
   b) a variable resistance coupled between the output of said last inverter and the input of said first inverter, said variable resistance being configured to vary its resistance in response to a control input;
   c) a tank comprising an inductor, a capacitor, an input tank node coupled to the output of said last inverter, and an output tank node, said variable resistance coupling said output tank node to the input of said first inverter; and
   d) a trip point circuit coupled between said tank and said inverter chain, said trip-point circuit configured to maintain a low logic signal at input of said first inverter when a voltage potential at said output tank node is below a predetermined level;
   wherein:
   said trip-point circuit comprises a first diode chain consisting of a first plurality of diodes connected in series and a second diode chain consisting of a second plurality of diodes connected in series, said first diode chain being connected to said second diode chain at a junction diode node;
   a first diode node at a first end of said first diode chain is connected to a first power rail and said junction diode node is at a second end of said first diode chain opposite said first end of said first diode chain;
   a second diode node at a first end of said second diode chain is connected to a second power rail and said junction diode node is at a second end of said second diode chain opposite said first end of said second diode chain;
   said output tank node is coupled to said junction diode node;
   said first plurality of diodes are connected anode to cathode in sequence;
   said second plurality of diodes are connected anode to cathode in sequence;
   said first end of said first diode chain is comprised of an anode and said second end of said first diode chain is comprised of a cathode; and
   said first end of said second diode chain is comprised of a cathode and said second end of said second diode chain is comprised of an anode;
   whereby the cathode at said second end of said first diode chain is connected to the anode of said second end of said second diode chain.

8. The ring oscillator of claim 7, wherein said oscillator output has a frequency determined at least in part by said variable resistance.

9. A phase-locked loop comprising the ring oscillator of claim 1, the phase-locked loop further comprising a frequency detector.

10. The ring oscillator of claim 1, wherein:
said first plurality of diodes are connected anode to cathode in sequence;
said second plurality of diodes are connected anode to cathode in sequence;
said first end of said first diode chain is comprised of an anode and said second end of said first diode chain is comprised of a cathode; and
said first end of said second diode chain is comprised of a cathode and said second end of said second diode chain is comprised of an anode;
whereby the cathode at said second end of said first diode chain is connected to the anode of said second end of said second diode chain.

* * * * *